(12) United States Patent
Aikawa et al.

(10) Patent No.: US 6,917,332 B2
(45) Date of Patent: Jul. 12, 2005

(54) MULTIELEMENT PLANAR ANTENNA (75) Inventors: Masayoshi Aikawa, 26-11, Nara 2-chome, Aoba-ku, Yokohama-shi, Kanagawa (JP); Eisuke Nishiyama, Saga (JP); Kozo Egashira, Saga (JP); Fumio Asamura, Saitama (JP); Takeo Oita, Saitama (JP)

(73) Assignees: Nihon Dempa Kogyo Co., Ltd., Tokyo (JP); Masayoshi Aikawa, Yokohama (JP)

( * ) Notice: Subject to any disclaimer, the term of this patent is extended or adjusted under 35 U.S.C. 154(b) by 241 days.

(21) Appl. No.: 10/262,918

(22) Filed: Oct. 2, 2002

(65) Prior Publication Data

US 2004/0041732 A1 Mar. 4, 2004

(30) Foreign Application Priority Data

Oct. 3, 2001 (JP) ...................................... 2001-308014

(51) Int. Cl.$^7$ ............................................... H01Q 1/38
(52) U.S. Cl. ............................... 343/700 MS; 343/824; 343/853
(58) Field of Search .......................... 343/700 MS, 850, 343/853, 824, 846, 767, 770

(56) References Cited

U.S. PATENT DOCUMENTS

| 5,914,688 A | * | 6/1999 | Andersson | ........... 343/700 MS |
| 6,124,830 A | * | 9/2000 | Yuanzhu | .............. 343/700 MS |
| 6,252,549 B1 | * | 6/2001 | Derneryd | ............. 343/700 MS |

* cited by examiner

Primary Examiner—Hoang V. Nguyen
(74) Attorney, Agent, or Firm—Katten Muchin Zavis Rosenman (57) ABSTRACT

A multielement planar antenna has a substrate, a plurality of antenna element pairs disposed on a first main surface of said substrate, each of the antenna element pairs including first and second antenna elements each made of a circuit conductor, a metal conductor disposed on a second main surface of the substrate, and a slot line defined in the metal conductor. Each of the antenna element pairs has a microstrip line interconnecting the first and second antenna elements. The slot line crosses the microstrip lines and is electromagnetically coupled to the microstrip lines for feeding the first and second antenna elements. The slot line is fed at its central area by a microstrip line or a coplanar line.

16 Claims, 9 Drawing Sheets

MULTIELEMENT PLANAR ANTENNA

BACKGROUND OF THE INVENTION

1. Field of the Invention

The present invention relates to a high-frequency multielement array planar antenna, and more particularly to a multielement planar antenna which employs microstrip lines for improved sensitivity and has active devices and integrated circuits (ICs) mounted thereon for use as an active antenna.

2. Description of the Related Art

Planar antennas have widely been used as microwave and millimeter wave antennas in the fields of radio communications and satellite broadcasting applications. Generally, planar antennas include microstrip line antennas and slot line antennas. Of these planar antennas, microstrip line antennas find wider use than slot line antennas because they have a simpler feeder structure and better radiating characteristics. However, since the microstrip line antennas have a low antenna gain, it is customary for them to be constructed as a multielement array antenna having a plurality of antenna elements.

Figure 1:
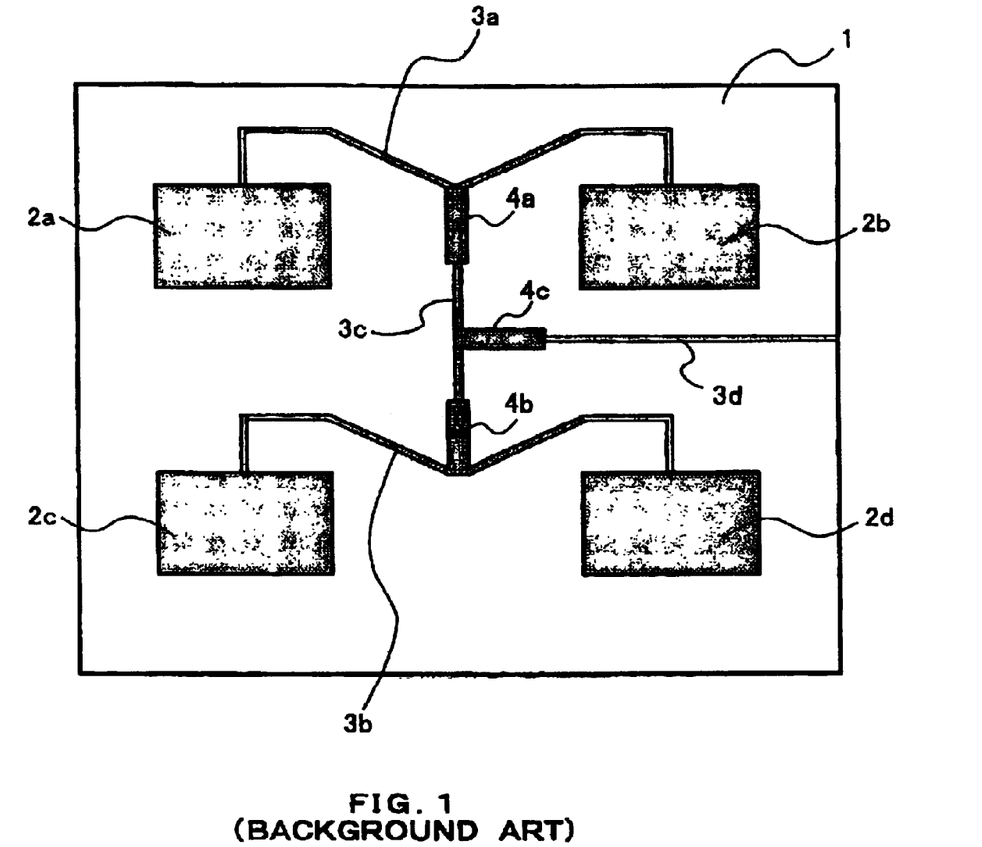
FIG. 1 is a plan view of a conventional multielement planar antenna.

FIG. 1 is a plan view of a conventional multielement planar antenna. As shown in FIG. 1, the conventional multielement planar antenna has substrate 1 made of a dielectric material and a plurality of circuit conductors, each functioning as an antenna element, disposed in a matrix on one main surface of substrate 1. In FIG. 1, the multielement planar antenna has a matrix of four antenna elements 2a through 2d each comprising a rectangular circuit conductor. A ground conductor in the form of a metal conductor is disposed on the other main surface of substrate 1. The antenna elements and the ground conductor jointly make up a microstrip line resonator in coaction with an electric field generated between the two main surfaces of substrate 1 and a magnetic field generated due to the electric field. Feeding lines are connected to respective antenna elements 2a through 2d to form the planar antenna. The antenna frequency of transmission and reception in the planar antenna generally correspond with the resonant frequency of the microstrip line resonator.

The feeding lines are disposed on the one main surface of substrate 1, and cooperate with the ground conductor on the other main surface of substrate 1 in forming microstrip lines. The feeding lines extend from a feeding end and are branched and connected in parallel to the respective antenna elements for thereby feeding the antenna elements through a parallel in-phase branched structure. Specifically, antenna elements 2a, 2b are connected to each other by feeding microstrip line 3a, and antenna elements 2c, 2d are connected to each other by feeding microstrip line 3b. Feeding Microstrip lines 3a, 3b are connected to each other by feeding microstrip line 3c, which is connected to feeding microstrip line 3d connected to the feeding end. To achieve impedance matching between the feeding microstrip lines, matching circuits 4a through 4c are incorporated in respective regions where a feeding microstrip line is branched into two feeding microstrip lines. Matching circuits 4a through 4c are arranged as wider regions of some feeding microstrip lines.

Since the feeding circuit is essentially of a parallel in-phase branched circuit on the conventional microstrip line planar antenna with plural antenna elements, antenna elements 2a through 2d are required to be fed in the same direction at all times. Therefore, the sum of the lengths of feeding microstrip lines 3a through 3d is basically large, and additionally large because of matching circuits 4a through 4c. In FIG. 1, each of antenna elements 2a through 2d is fed from an upper side of the rectangular circuit conductor thereof. However, each of antenna elements 2a through 2d may be fed from a lower side, a left side, or a right side of the rectangular circuit conductor thereof insofar as it is fed in the same direction.

Furthermore, since impedance matching at the branched points of the feeding microstrip lines is indispensable, matching circuits 4a through 4c tend to cause a large feeding loss. As antenna elements 2a through 2d are energized in the same direction, the feeding lines need to be positioned around antenna elements 2a through 2d, resulting in a likelihood of interference between the antenna elements and the feeding lines. For these reasons, it is difficult to reduce the size of the multielement planar antenna of the type described above, and the multielement planar antenna fails to provide sufficient electric characteristics including sensitivity, directivity, and the like.

A microstrip line structure is an unbalanced transmission line in which a conductor pattern and a ground conductor, which serve as an electric pair, are disposed respectively on one and other main surfaces of a substrate. Even if attempts are made to mount circuit devices such as ICs including bare chips, MMICs (monolithic microwave integrated circuits.) and the like, and antenna elements integrally on one main surface of the substrate of a microstrip line planar antenna thereby to produce a transmission/reception module, a complex connection structure is needed to connect ground terminals of the integrated circuits and the MMICS to the ground conductor. The complex connection structure makes it impossible to employ a bare chip mounting process based on the bump technology and a surface mounting process for packaged ICs.

SUMMARY OF THE INVENTION

It is therefore an object of the present invention to provide a multielement planar antenna which can be reduced in size, has improved electric characteristics including sensitivity, directivity, etc., and can be designed for higher functionality.

According to the present invention, the above object can be achieved by a multielement planar antenna comprising a substrate, a plurality of antenna element pairs disposed on a first main surface of the substrate, each of the antenna element pairs comprising first and second antenna elements each made of a circuit conductor, a metal conductor disposed on a second main surface of the substrate, a slot line defined in the metal conductor, and means for feeding the slot line, each of the antenna element pairs having a microstrip line interconnecting the first and second antenna elements, the slot line crossing the microstrip lines and electromagnetically coupled thereto for feeding the first and second antenna elements.

The microelement planar antenna according to the present invention is based on a maximum use of transmission characteristics and line structures of microstrip lines and a slot line which are formed on both main surfaces of a substrate which is made of a dielectric material, for example. Some portions of the microstrip lines may functionally be replaced with a coplanar line or coplanar waveguide that is disposed on the main surface of the substrate on which the slot line is disposed, the coplanar line being connected to the slot line.

While microstrip lines and coplanar lines are unbalanced transmission lines, slot lines are balanced transmission lines.

Based on this fact, a branch from a slot line to a microstrip line is of an opposite-phase serial branch, and a branch from a microstrip line to a slot line or a branch from a coplanar line to a slot line is of an in-phase parallel branch. By combining these branches, the length of a feeding line is minimized, and matching circuits are eliminated. Since a slot line and a coplanar line are of a coplanar transmission line structure, allowing transmission lines to be formed on one main surface, circuit devices such as ICs can easily be surface-mounted on the multielement planar antenna, making it possible to design the multielement planar antenna easily for higher functionality.

DETAILED DESCRIPTION OF THE INVENTION

Figure 2A:
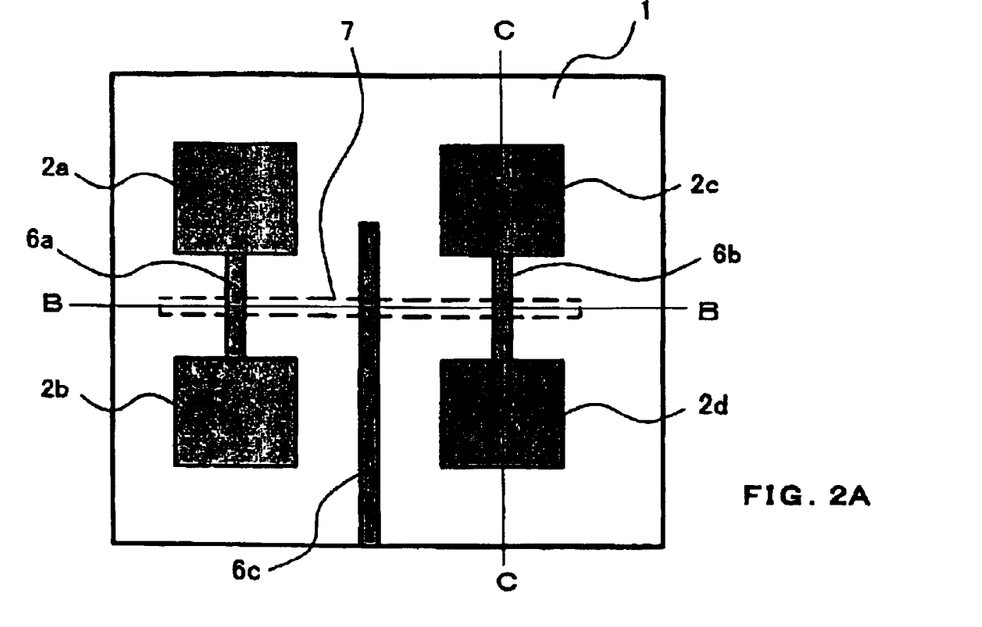
FIG. 2A is a plan view of a multielement planar antenna according to a first embodiment of the present invention.
Figure 2B:
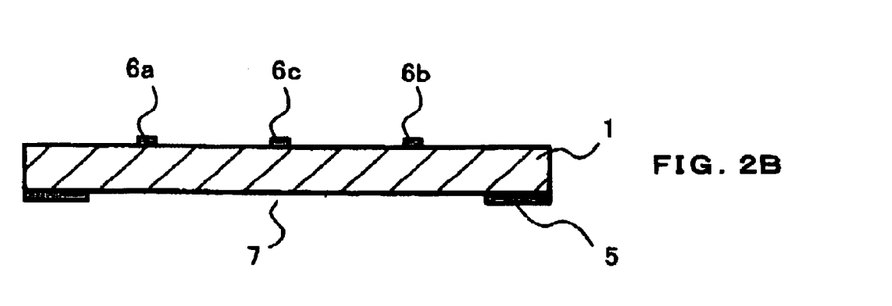
FIG. 2B is a cross-sectional view taken along line B—B of FIG. 2A.
Figure 2C:
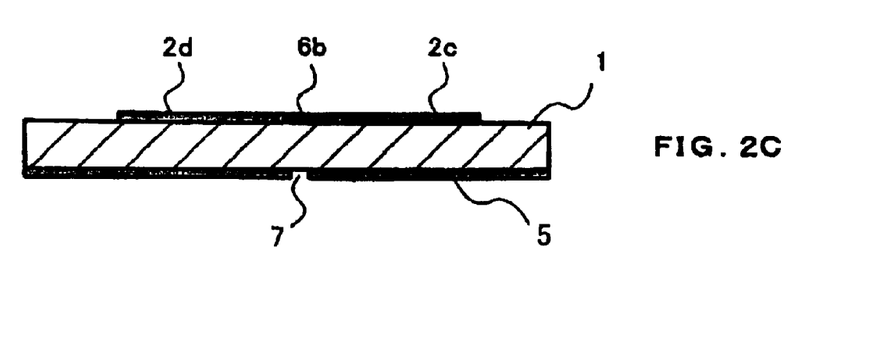
FIG. 2C is a cross-sectional view taken along line C—C of FIG. 2A.

As shown in FIGS. 2A through 2C, a multielement planar antenna according to a first embodiment of the present invention has substrate 1 made of a dielectric material, a matrix of antenna elements each in the form of a microstrip line disposed on one main surface of substrate 1, and grounded metal conductor 5 disposed on and covering substantially entirety the other main surface of substrate 1. In the illustrated embodiment, four substantially rectangular antenna elements 2a through 2d arranged in two rows and two columns are disposed on the one main surface of substrate 1.

The multielement planar antenna also has first microstrip line 6a disposed on the one main surface of substrate 1 and extending between and joined to confronting sides of antenna elements 2a, 2b which are positioned on a left portion (as shown) of substrate 1, and second microstrip line 6b disposed on the one main surface of substrate 1 and extending between and joined to confronting sides of antenna elements 2c, 2d which are positioned on a right portion (as shown) of substrate 1. Antenna elements 2a, 2b serve as a first antenna element pair, and antenna elements 2c, 2d as a second antenna element pair. First and second microstrip lines 6a, 6b extend parallel to each other. On the other main surface of substrate 1, metal conductor 5 has slot line 7 defined therein which extends in a direction perpendicular to the direction in which microstrip lines 6a, 6b extend. Slot line 7 electromagnetically couples to microstrip lines 6a, 6b thorough substrate 1, and is formed as a slender opening in metal conductor 5. Slot line 7 is disposed across microstrip lines 6a, 6b and has opposite ends projecting outwardly from the positions where slot line 7 crosses microstrip lines 6a, 6b. The length by which the opposite ends of slot line 7 project from the positions where slot line 7 crosses microstrip lines 6a, 6b should preferably be selected such that the projecting ends of slot line 7 as viewed from those crossing positions are regarded as open ends, i.e., the projecting ends have a high impedance close to an infinitely large impedance. Stated otherwise, if the frequency used by the antenna has a wavelength of $\lambda$, then the length from one of the crossing positions to the corresponding projecting end of slot line 7 is set to substantially $\lambda/4$.

The multielement planar antenna also has third microstrip line 6c disposed on the one main surface of substrate 1 and extending from an end of substrate 1 perpendicularly to the direction in which slot line 7 extends. Third microstrip line 6c extends across a central region of slot line 7. The distal end of third microstrip line 6c projecting from the position in which third microstrip line 6c crosses slot line 7 should preferably have a length selected such that the distal end of third microstrip line 6c as viewed from the crossing position has a high impedance close to an infinitely large impedance.

Microstrip lines 6a through 6c and slot line 7 function as feeding lines for antenna elements 2a through 2d.

With the above arrangement, slot line 7 to microstrip lines 6a, 6b provide feeding lines in an opposite-phase series branched structure. Specifically, first microstrip line 6a energizes antenna elements 2a, 2b of the first antenna element pair in opposite phase to each other, and second microstrip line 6b energizes antenna elements 2c, 2d of the second antenna element pair in opposite phase to each other. Thus, antenna elements 2a, 2b of the first antenna element pair are energized from mutually opposite sides thereof, and antenna elements 2c, 2d of the first antenna element pair are also energized from mutually opposite sides thereof. Stated otherwise, antenna elements 2a, 2c are energized from lower sides thereof (as shown), and antenna elements 2b, 2d are energized from upper sides thereof (as shown).

Slot line 7 is fed from third microstrip line 6c extending from an edge of substrate 1 in an in-phase parallel branched structure. Since the overall feeding line needs to have a minimum length up to a remotest antenna element from a feeding end, the multielement planar antenna according to the first embodiment provides a shortest feeding line from the end of substrate 1 as the feeding end to antenna elements 2a through 2d.

Slot line 7 is fed from third microstrip line 6c in the in-phase parallel branched structure and first and second microstrip lines 6a, 6b are fed from slot line 7 in the opposite-phase series branched structure. Consequently, if the characteristic impedance of each of first and second microstrip lines 6a, 6b is set to ½ of the characteristic impedance of slot line 7, then no matching circuit is required. For example, when the characteristic impedance of third microstrip line 6c is 50 ohm, then since it is connected to slot line 7 in the in-phase parallel branched structure, the impedance of third microstrip line 6c and the impedance of slot line 7 are matched if the characteristic impedance of slot line 7 is 100 ohm. when each of the characteristic impedances of first and second microstrip lines 6a, 6b is 50 ohm, then no matching circuit is required at all. Stated otherwise, inasmuch as branches are successively made from a microstrip line via a slot line to microstrip lines, no matching circuit is required simply by setting characteristic impedances. This arrangement is advantageous in that the length of the feeding system is further reduced and any feeding loss which would be caused by matching circuits is not produced.

As described above, because antenna elements paired with each other by a microstrip line are fed from mutually opposite sides (upper and lower sides, for example), feeding lines are eliminated from around the antenna elements, thereby preventing mutual interference between feeding lines and the antenna elements. The multielement planar antenna thus constructed according to the first embodiment can, therefore, be reduced in size and can have improved electric characteristics including sensitivity, directivity, and the like.

Figure 3A:
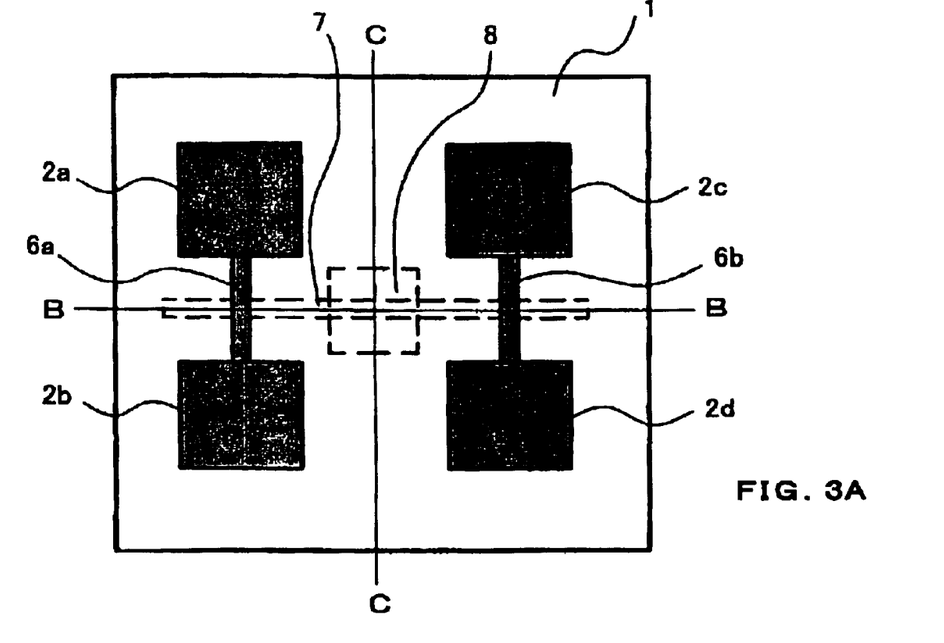
FIG. 3A is a plan view of a modification of the multielement planar antenna according to the first embodiment.
Figure 3B:
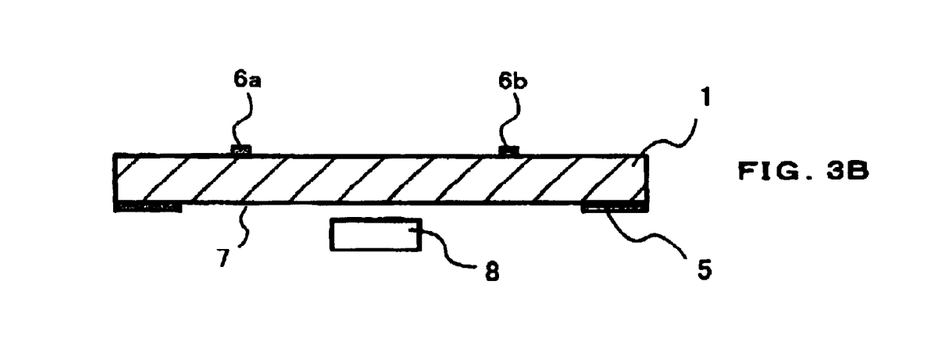
FIG. 3B is a cross-sectional view taken along line B—B of FIG. 3A.
Figure 3C:
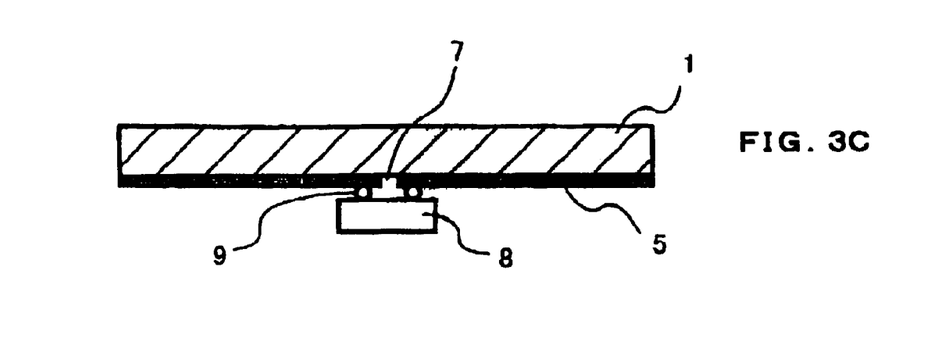
FIG. 3C is a cross-sectional view taken along line C—C of FIG. 3A.

In the above multielement planar antenna, slot line 7 is fed by third microstrip line 6c. However, a central region of slot line 7 may be used as a feeding point, and feeding lines may directly be connected to two transversely opposite points on both sides of slot line 7 at the feeding point for energizing slot line 7. According to such a modification, as shown in FIGS. 3A through 3C, circuit device 8 such as an IC including a bare chip, an MMIC, or the like is surface-mounted at the feeding point by bumps 9, for example, thus producing a transmission/reception module which includes the antenna elements and circuit device 8 that are integrally combined with each other. If circuit device 8 is an IC, then input and output terminals of the IC are connected to opposite sides of slot line 7. In the transmission/reception module, the multielement planar antenna provides higher functionality by having a phase shifter included in the IC control the phase shifting of transmitted and received signals for directivity, making an amplification factor variable to control a transmission/reception gain.

Figure 4A:
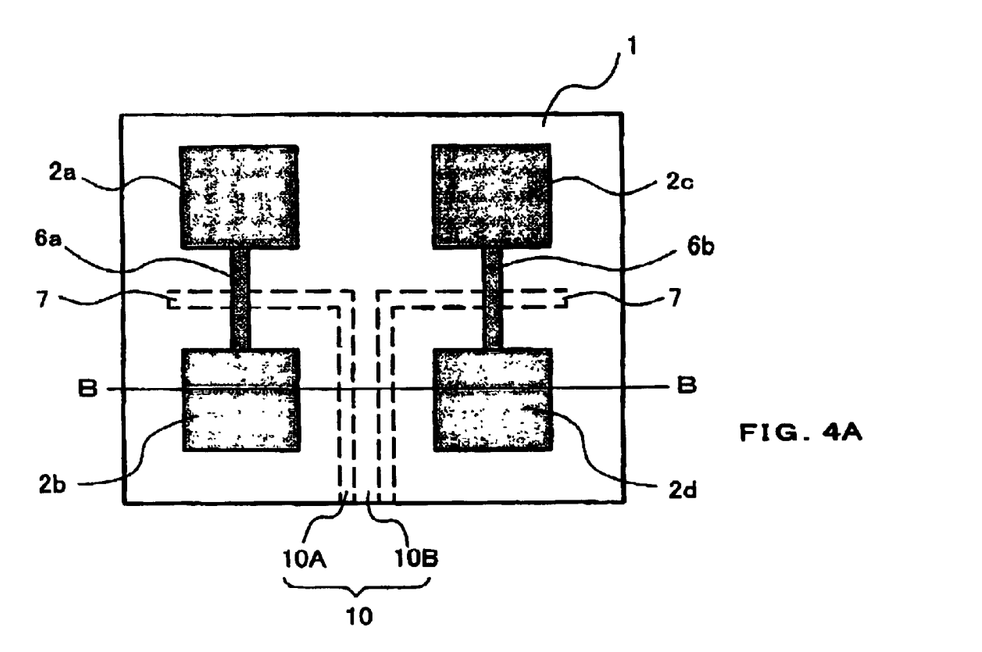
FIG. 4A is a plan view of a multielement planar antenna according to a second embodiment of the present invention.
Figure 4B:
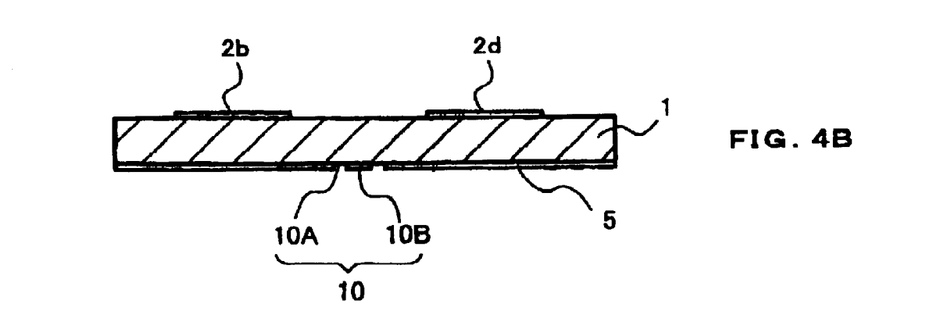
FIG. 4B is a cross-sectional view taken along line B—B of FIG. 4A.

A multielement planar antenna according to a second embodiment of the present invention will be described below with reference to FIGS. 4A and 4B. Those parts shown in FIGS. 4A and 4B which are identical to those shown in FIGS. 2A through 2C are denoted by identical reference characters.

In the multielement planar antenna according to the first embodiment, slot line 7 is energized by third microstrip line 6c. In the multielement planar antenna according to the third embodiment, however, slot line 7 is energized by a coplanar line or coplanar waveguide disposed on the other main surface of substrate 1. Coplanar line 10 extends from an edge of substrate 1 to slot line 7, is connected to slot line 7, and electromagnetically couples to slot line 7. Coplanar line 10 comprises two narrow parallel grooves 10A defined in metal conductor 10B disposed on the other main surface of substrate 1, with metal conductor 10B between narrow grooves 10A being used as a signal line. Narrow grooves 10A are connected to slot line 7 defined as an opening in metal conductor 5. Signal line 10B is sandwiched between narrow grooves 10A, reaches slot line 7, extends across slot line 7, and is connected to metal conductor 5 on the other side of slot line 7.

With the above arrangement, a overall feeding line from the feeding end to antenna elements 2a through 2d is made up of coplanar line 10, slot line 7, and microstrip lines 6a, 6b. Slot line 7 is fed by coplanar line 10 through a parallel in-phase branched structure, and first and second microstrip lines 6a, 6b are fed by slot line 7 through an opposite-phase series branched structure. With the multielement planar antenna according to the second embodiment, as with the multielement planar antenna according to the first embodiment, the overall feeding line for energizing the antenna elements has a minimum length, no matching circuit is required, and mutual interference between the feeding lines and the antenna elements is prevented.

Figure 5A:
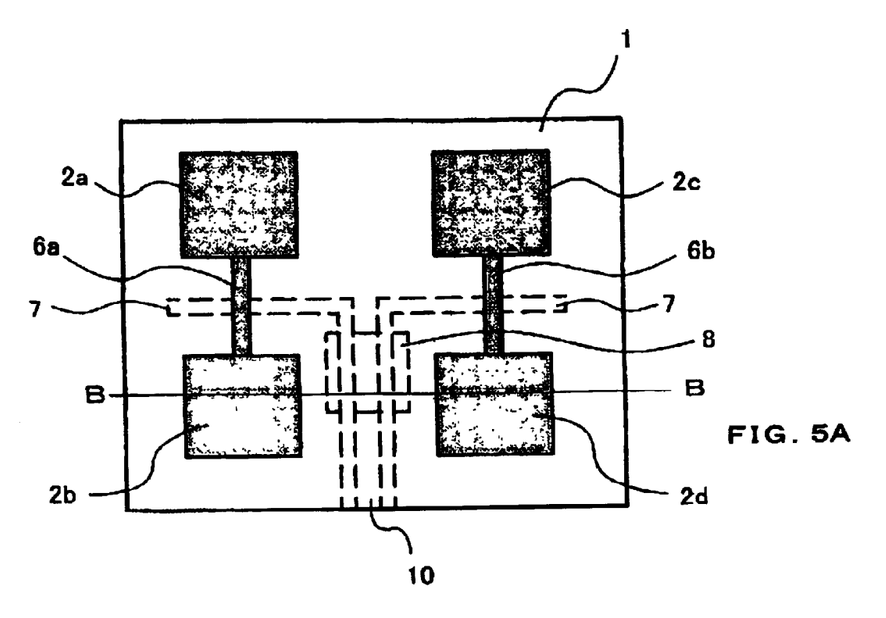
FIG. 5A is a plan view of a modification of the multielement planar antenna according to the second embodiment.
Figure 5B:
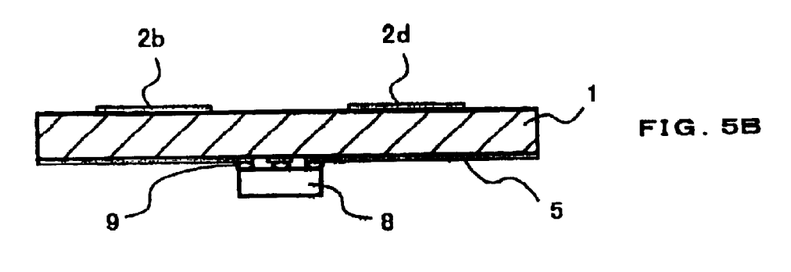
FIG. 5B is a cross-sectional view taken along line B—B of FIG. 5A.

The multielement planar antenna according to the second embodiment may be modified as shown in FIGS. 5A and 5B. In FIGS. 5A and 5B, circuit device 8 such as an IC including a bare chip, an MMIC, or the like is surface-mounted on coplanar line 10 disposed on the other main surface of substrate 1, thus producing a transmission/reception module which includes the antenna elements and circuit device 8 that are integrally combined with each other. If circuit device 8 is an IC circuit, then input and output terminals of the IC are connected to coplanar line 10.

A multielement planar antenna according to a second embodiment of the present invention will be described below with reference to FIG. 6. In the multielement planar antenna according to each of the previous embodiments, four antenna elements 2a through 2d are arranged in a matrix on the one main surface of substrate 1. According to the third embodiment, an increased number of antenna elements are disposed on the one main surface of substrate 1.

Figure 6:
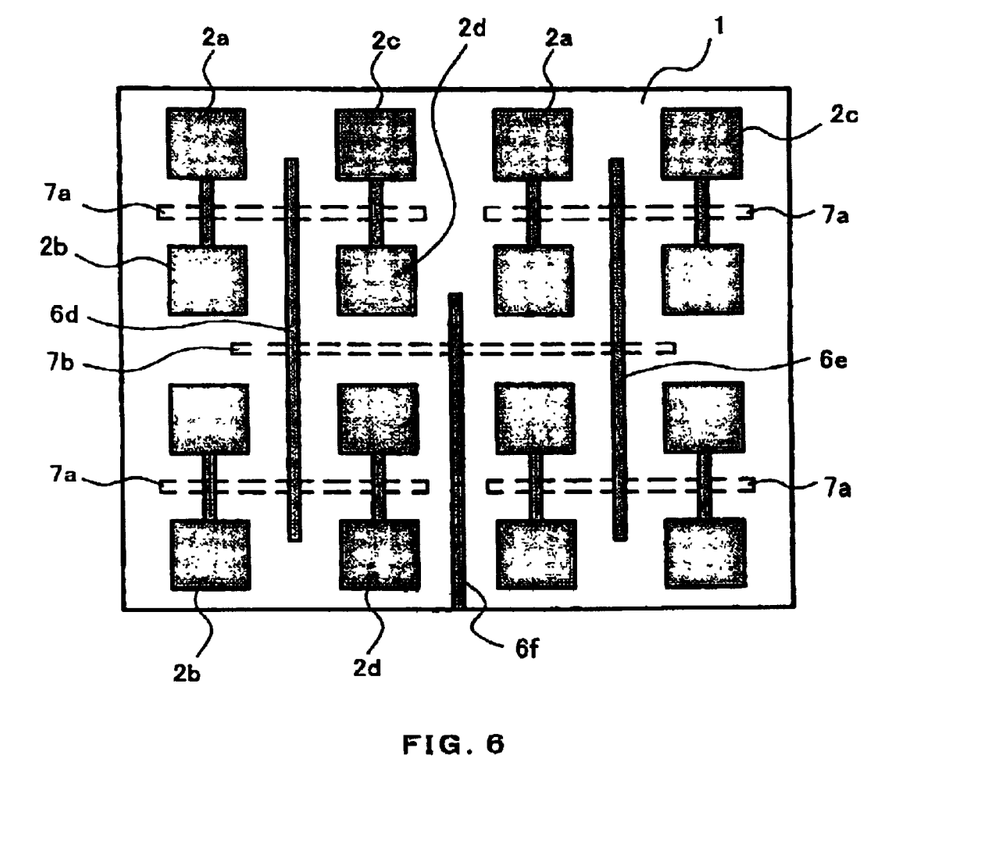
FIG. 6 is a plan view of a multielement planar antenna according to a third embodiment of the present invention.

The multielement planar antenna shown in FIG. 6 has four sets, arranged in two rows and two columns, of four antenna elements 2a through 2d employed in the previous embodiments.

Specifically, four sets of four antenna elements 2a through 2d, i.e., a total of 16 antenna elements, each comprising a substantially rectangular circuit conductor, are disposed on a first main surface of substrate 1. In each of the sets, antenna elements 2a, 2b of the first antenna element pair are connected to each other by microstrip line 6a, and antenna elements 2c, 2d of the second antenna element pair are connected to each other by microstrip line 6b, as with the previous embodiments. A metal conductor is disposed on and covers substantially entirely a second main surface of substrate 1. In each set, first slot line 7a is defined in the metal conductor across microstrip lines 6a, 6b. First slot line 7a corresponds to slot line 7 in the above embodiments, and extends across microstrip lines 6a, 6b at longitudinally midpoints thereof.

Microstrip line 6d is disposed on the first main surface of substrate 1 across first slot lines 7a in the upper and lower sets of antenna elements on a left portion as shown of substrate 1. Likewise, microstrip line 6e is disposed on the first main surface of substrate 1 across first slot lines 7a in the upper and lower sets of antenna elements on a right portion as shown of substrate 1. These microstrip lines 6d, 6e serve to electromagnetically couple to and feed slot lines 7a in the respective sets of antenna elements, and extend vertically as shown across first slot lines 7a at longitudinally midpoints thereof.

Second slot line 7b is disposed on the second main surface of substrate 1 across microstrip lines 6d, 6e. Second slot line 7b serves to electromagnetically couple to and feed microstrip lines 6d, 6e, and extends horizontally as shown centrally on substrate 1 across these microstrip lines 6d, 6e at longitudinally midpoints thereof.

Microstrip line 6f is disposed on the first main surface of substrate 1 in a direction perpendicular to the direction in which second slot line 7b extends. Microstrip line 6f extends from an end of substrate 1 and crosses second slot line 7b at a longitudinally midpoint thereof. Microstrip line 6f serves to electromagnetically couple to and feed second slot line 7b.

With the above arrangement, the multielement planar antenna has an increased number of antenna elements for increased sensitivity. On this multielement planar antenna, a feeding path is basically made up of a microstrip line/a slot line/microstrip lines/(and slot lines). Stated otherwise, connections, i.e., a feeding structure, are established from a parallel in-phase branched structure to an opposite-phase series branched structure. As with the previous embodiments, therefore, the overall feeding line for energizing the antenna elements has a minimum length, no matching circuit is required, and mutual interference between the feeding lines and the antenna elements is prevented. A transmission/reception module employing the multielement planar antenna according to the third embodiment may be constructed by surface-mounting a circuit device such as an IC on second slot line 7b.

Figure 7:
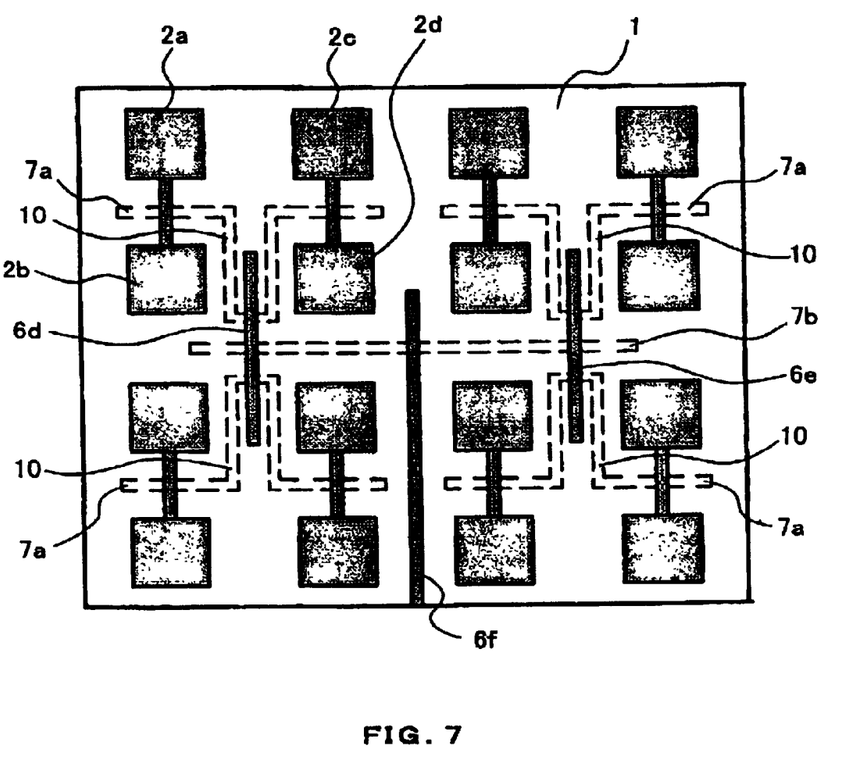
FIG. 7 is a plan view of a modification of the multielement planar antenna according to the third embodiment.

In the above planar antenna, the upper and lower sets of antenna elements as shown are connected to each other, and fed, by microstrip lines 6d, 6e. However, as shown in FIG. 7, the upper and lower sets of antenna elements may be connected to each other, and fed, by microstrip lines and coplanar lines. Specifically, in FIG. 7, in the respective sets of antenna elements, coplanar lines 10 connected to first slot lines 7a are disposed on the second main surface of substrate 1, and microstrip lines 6d, 6e are disposed on the first main surface of substrate 1 so as to have ends thereof overlapping coplanar lines 10. A feeding path extending from one of microstrip lines 6d, 6e via coplanar line 10 to first slot line 7a is provided by connections, i.e., a feeding structure, from a parallel in-phase branched structure to an opposite-phase series branched structure. Therefore, the multielement planar antenna according to the third embodiment offers the same advantages as the multielement planar antennas according to the previous embodiments.

Figure 8:
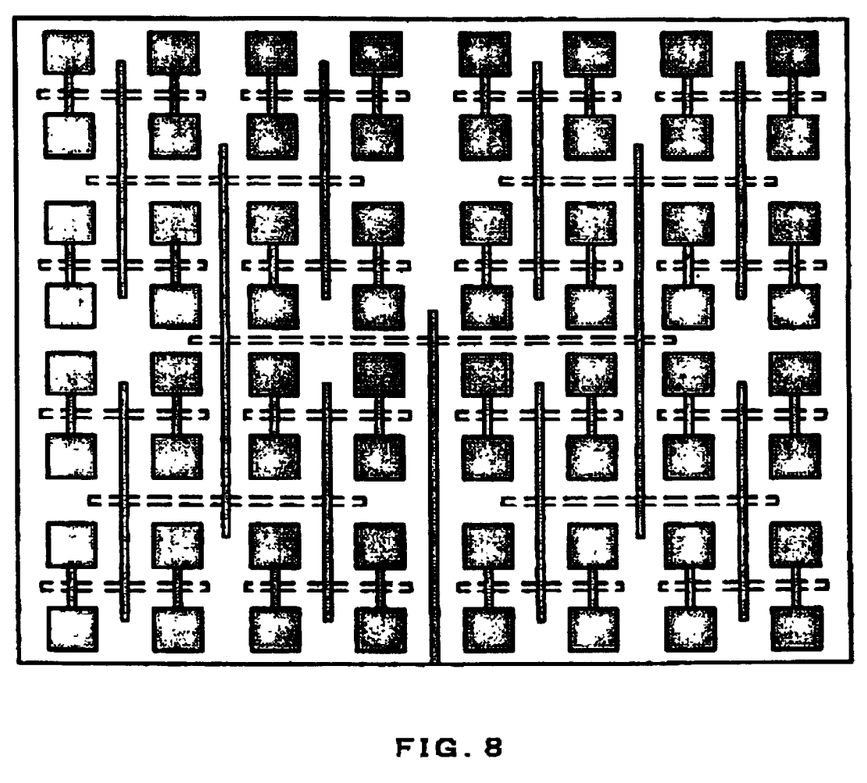
FIG. 8 is a plan view of another modification of the multielement planar antenna according to the third embodiment.

FIGS. 6 and 7 show 16-element planar antennas. According to the present invention, a similar hierarchical feeding system may be incorporated to produce a multielement planar antenna such as a 32-element planar antenna, 64-element planar antenna, 128-element planar antenna, etc. FIG. 8 shows a 64-element planar antenna.

Figure 9:
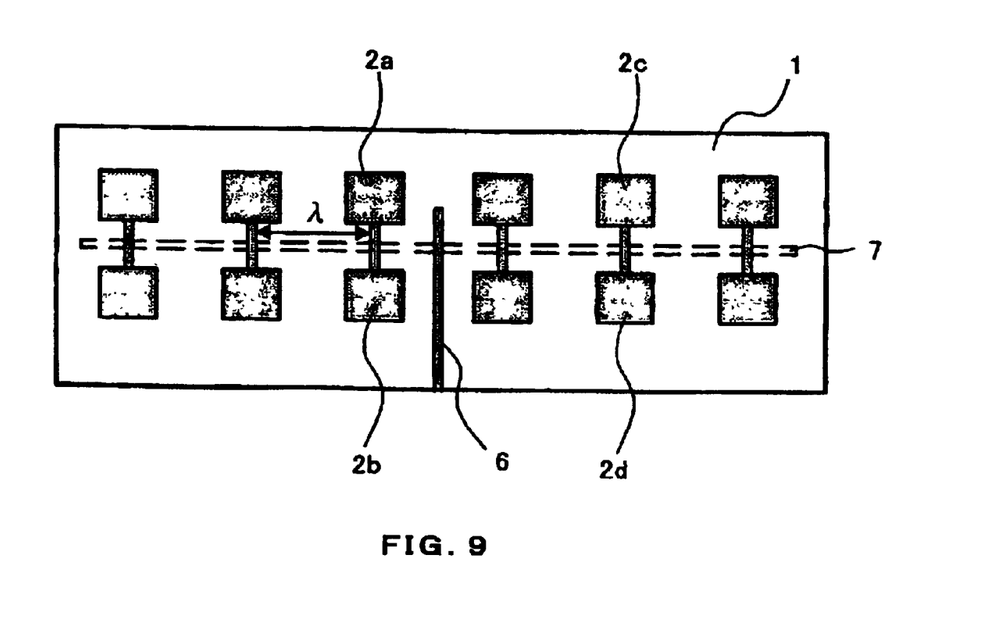
FIG. 9 is a plan view of a multielement planar antenna according to a fourth embodiment of the present invention.

A multielement planar antenna according to a fourth embodiment of the present invention will be described below with reference to FIG. 9. In the previous embodiments, two antenna elements are connected to each other by a microstrip line, providing an antenna element pair, and two antenna element pairs are connected to each other and fed by a single slot line. However, more antenna element pairs may be directly connected to one slot line. In the multielement planar antenna shown in FIG. 9, six antenna element pairs are connected to slot line 7 disposed on the second main surface of substrate 1.

More specifically, on the first main surface of substrate 1, feeding microstrip line 6 extends from one side of substrate 1 and is electromagnetically coupled to slot line 7 at a longitudinal midpoint thereof. Three pairs of antenna elements are disposed on a right side of the position where microstrip line 6 crosses slot line 7, and three pairs of antenna elements are disposed on a left side of the position where microstrip line 6 crosses slot line 7. Adjacent two of the antenna element pairs are spaced from each other by one wavelength (λ). The number of antenna element pairs disposed on slot line 7 and the spacing between adjacent two of the antenna element pairs are set to appropriate values for obtaining desired antenna directivity.

What is claimed is:

1. A multielement planar antenna comprising:

a substrate;

a plurality of antenna element pairs disposed on a first main surface of said substrate, each of said antenna element pairs comprising first and second antenna elements each made of a circuit conductor;

a metal conductor disposed on a second main surface of said substrate;

a slot line defined in said metal conductor; and means for feeding said slot line;

each of said antenna element pairs having a microstrip line interconnecting said first and second antenna elements;

said slot line crossing the microstrip lines and electromagnetically coupled thereto for feeding said first and second antenna elements.

2. The multielement planar antenna according to claim 1, wherein each of said first and second antenna elements comprises a microstrip line antenna element.

3. The multielement planar antenna according to claim 2, wherein each of said antenna element has a substantially rectangular plane shape.

4. The multielement planar antenna according to claim 1, wherein each of said microstrip lines has longitudinally central area crossing said slot line, and extends in a direction perpendicular to a direction in which said slot line extends.

5. The multielement planar antenna according to claim 1, wherein said antenna element pairs comprise at least two antenna element pairs disposed on each side of a feeding point at which said feeding means energizes said slot line.

6. The multielement planar antenna according to claim 5, wherein said antenna element pairs are disposed at a interval substantially equal to a wavelength of a frequency handled by the multielement planar antenna.

7. The multielement planar antenna according to claim 1, wherein said antenna element pairs comprise one antenna element pair disposed on each side of a feeding point at which said feeding means energizes said slot line.

8. The multielement planar antenna according to claim 7, wherein said slot line has ends projecting from respective crossing positions in which said microstrip lines cross said slot line, such that the ends of said slot line are electrically open as viewed from said crossing positions.

9. The multielement planar antenna according to claim 8, wherein each of the ends of said slot line projecting from the respective crossing positions has a length set to about one-fourth of a wavelength of a frequency handled by the multielement planar antenna.

10. The multielement planar antenna according to claim 7, wherein said feeding point is located in a central area between crossing positions in which said microstrip lines cross said slot line.

11. The multielement planar antenna according to claim 10, wherein said feeding means comprises a second microstrip line disposed on said first main surface and electromagnetically coupled to said slot line.

12. The multielement planar antenna according to claim 10, wherein said feeding means comprises a coplanar line disposed on said first main surface and connected to said slot line.

13. The multielement planar antenna according to claim 12, further comprising a circuit device disposed on said second main surface and connected to said coplanar line.

14. The multielement planar antenna according to claim 7, further comprising a circuit device disposed on said second main surface and connected to said slot line.

15. The multielement planar antenna according to claim 7, further comprising:

first, second, third, and fourth sets disposed on said first main surface, each of said sets consisting of two of said antenna element pairs interconnected by said slot line;

a second microstrip line disposed on said first main surface and connecting the slot lines of the first and second sets to each other;

a third microstrip line disposed on said first main surface and connecting the slot lines of the third and fourth sets being connected to each other;

a second slot line disposed on said second main surface and connecting said second microstrip line and said third microstrip line being connected to each other; and second feeding means for energizing said second slot line at a central area thereof.

16. The multielement planar antenna according to claim 1, wherein said substrate comprises a dielectric substrate.

\* \* \* \* \*